(12) United States Patent
Hung

(10) Patent No.: US 6,867,127 B1
(45) Date of Patent: Mar. 15, 2005

(54) DIAMOND METAL-FILLED PATTERNS ACHIEVING LOW PARASITIC COUPLING CAPACITANCE

(75) Inventor: Chih-Ju Hung, Saratoga, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/327,283

(22) Filed: Dec. 19, 2002

(51) Int. Cl.[7] .......................................... H01L 21/4763
(52) U.S. Cl. ...................... 438/626; 438/631; 438/692; 438/760
(58) Field of Search ................................. 438/626, 631, 438/692, 760, 926, 666; 257/773

(56) References Cited

U.S. PATENT DOCUMENTS 5,639,697 A * 6/1997 Weling et al. .............. 438/633
5,854,125 A * 12/1998 Harvey ....................... 438/626

* cited by examiner

*Primary Examiner*—George Fourson
*Assistant Examiner*—Julio J. Maldonado
(74) *Attorney, Agent, or Firm*—Beyer Weaver & Thomas, LLP

(57) ABSTRACT

Provided are methods and composition for forming diamond metal-filled patterns above an integrated circuit substrate. A metal layer is formed above the integrated circuit substrate, which is then patterned such that a metal line is created. A plurality of diamond-shaped metal regions are then formed at least one of above and adjacent to the metal line formed on the integrated circuit substrate such that the density of metal on the integrated circuit substrate is greater than a specified density, thereby ensuring that a surface of dielectric formed above the metal line remains substantially planar after application of CMP to the dielectric layer.

11 Claims, 4 Drawing Sheets

The original physical database after adding diamond metal-filled patterns

Illustration of the original physical database before and after adding diamond filled patterns

The original physical database before adding diamond metal-filled patterns

The original physical database after adding diamond metal-filled patterns

Figure 1: Illustration of the original physical database before and after adding diamond filled patterns Figure 2: Illustration of the parasitic coupling capacitance introduced by the conventional square and the invented diamond metal-filled patterns

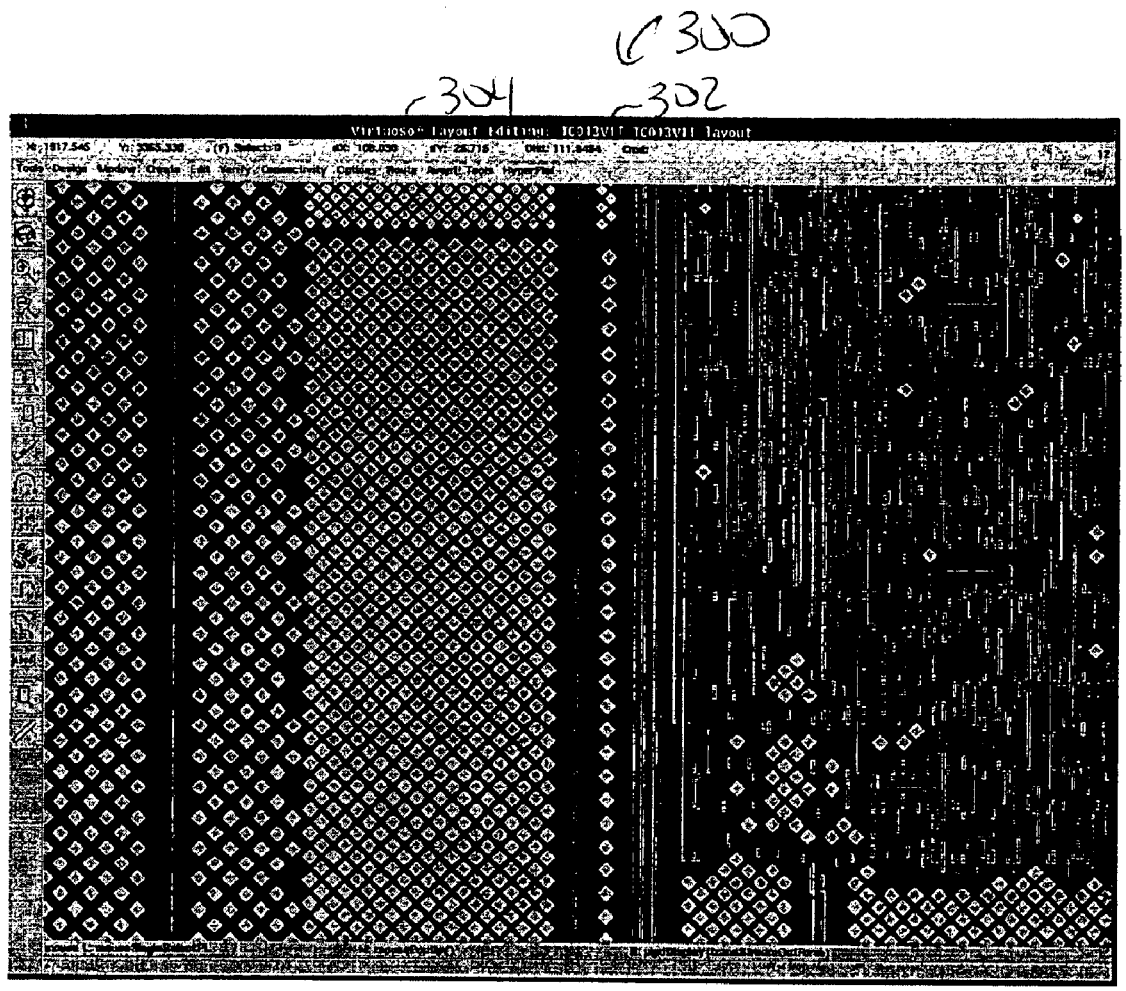
Figure 3: A original 0.13um physical design database was filled with the invented diamond metal-filled patterns.

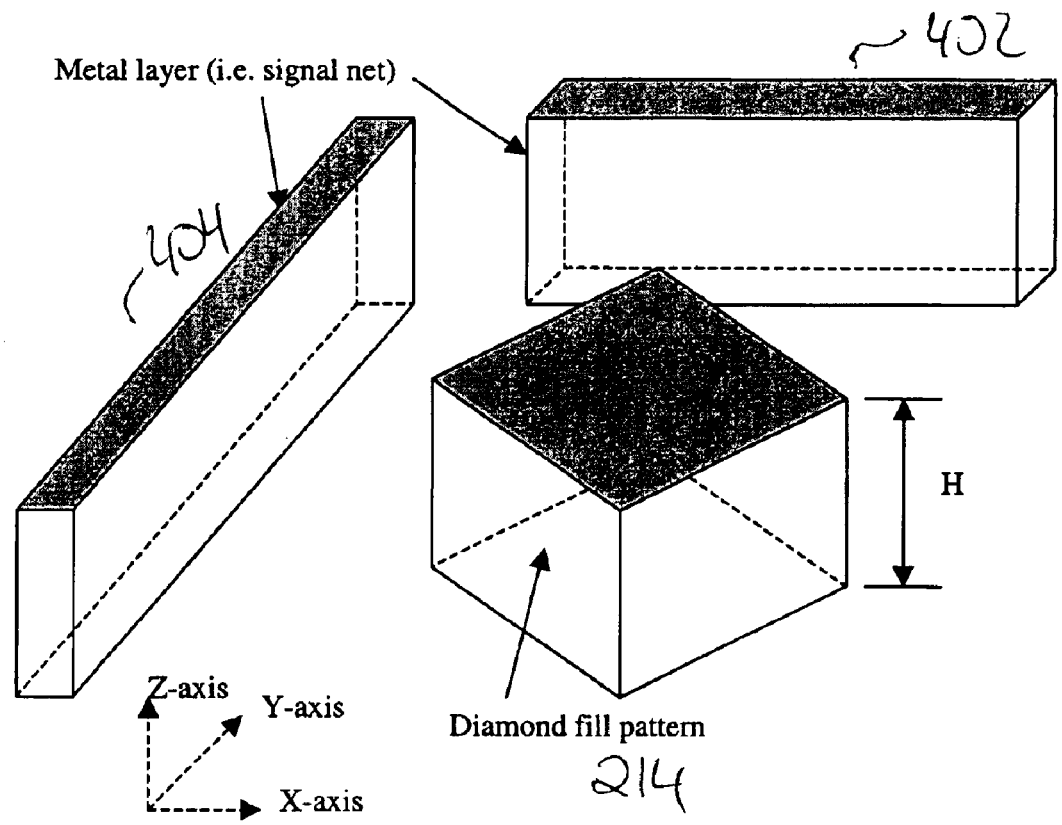
Figure 4: The illustration of the three-dimensional representative of the diamond fill patterns with respect to the metal lines (i.e. signal nets).

DIAMOND METAL-FILLED PATTERNS ACHIEVING LOW PARASITIC COUPLING CAPACITANCE

BACKGROUND OF THE INVENTION

1. Field of the Invention

The present invention relates to the formation of metal-filled patterns in semiconductor wafer fabrication. More particularly, the present invention relates to the formation of a diamond metal-filled patterns achieving low parasitic coupling capacitance.

2. Description of the Related Art

In recent years, chemical-mechanical polishing (CMP) has become the primary technique for planarizing interlayer dielectrics. Although CMP is effective at planarization, CMP processes are hampered by layout pattern sensitivities which cause certain regions on a chip to have thicker dielectric layers than other regions due to differences in the underlying topography. This problem has become particularly severe as performance requirements have increased, dimensions have scaled, and larger die sizes have appeared. CMP has also been widely used in VLSI technology development as a tool for creating shallow trench isolation and in damascene processes.

In order to reduce layout pattern dependent dielectric thickness variation, the layout pattern itself is changed via the introduction of metal-fill patterning. Metal-fill patterning is the process of filling the large open areas on each metal layer with a metal pattern, which is either grounded or left floating, to compensate for pattern-driven variations. Unfortunately, due to the confidential nature of metal-fill patterning practices and design rules, relatively little information about metal-fill patterning practices has been available to the public.

In addition to reducing layout pattern dependent dielectric thickness variation, metal-fill patterning practice should also minimize the parasitic capacitance associated with the metal-fill. However, conventional metal-fill generally introduces a substantial amount of parasitic capacitance due to capacitance between the metal-fill and metal lines of the integrated circuit formed on an integrated circuit substrate. In view of the above, it would be beneficial if metal-fill patterning with reduced parasitic coupling capacitance could be achieved.

SUMMARY OF THE INVENTION

Methods and apparatus for forming metal-fill on an integrated circuit substrate are disclosed. Specifically, the metal-fill is formed in diamond patterns. In this manner, advantages of metal-fill are achieved while achieving low parasitic coupling capacitance.

In accordance with one aspect, methods and composition for forming diamond metal-filled patterns above an integrated circuit substrate. A metal layer is formed above the integrated circuit substrate, which is then patterned such that a metal line is created. A plurality of diamond-shaped metal regions are then formed at least one of above and adjacent to the metal line formed on the integrated circuit substrate such that the density of metal on the integrated circuit substrate is greater than a specified density, thereby ensuring that a surface of dielectric formed above the metal line remains substantially planar after application of CMP to the dielectric layer.

In accordance with another aspect of the invention, the diamond metal-filled patterned regions are oriented at 45 degrees with respect to the metal line(s), as well as with respect to the substrate. The patterned regions may be 3-dimensional, 6-sided blocks, as well as substantially planar, 2-dimensional regions. Since the diamond-shaped regions are oriented at 45 degrees from the metal line(s) and the y-axis, the parasitic coupling capacitance is reduced while providing advantages of conventional metal-fill techniques.

These and other features and advantages of the present invention are described below with reference to the drawings.

BRIEF DESCRIPTION OF THE DRAWINGS

FIG. 3 depicts a physical design database in which diamond metal-fill patterns are used in accordance with various embodiments of the invention.

FIG. 4 depicts a three-dimensional view of a diamond metal-fill region with respect to the metal lines in accordance with various embodiments of the invention.

DETAILED DESCRIPTION OF THE PREFERRED EMBODIMENTS

In the following description, numerous specific details are set forth in order to fully illustrate preferred embodiments of the present invention. It will be apparent, however, that the present invention may be practiced without limitation to some specific details presented herein. For example, the metal-fill may be formed using various numbers of patterned regions as well as from different metals.

Figure 1A:
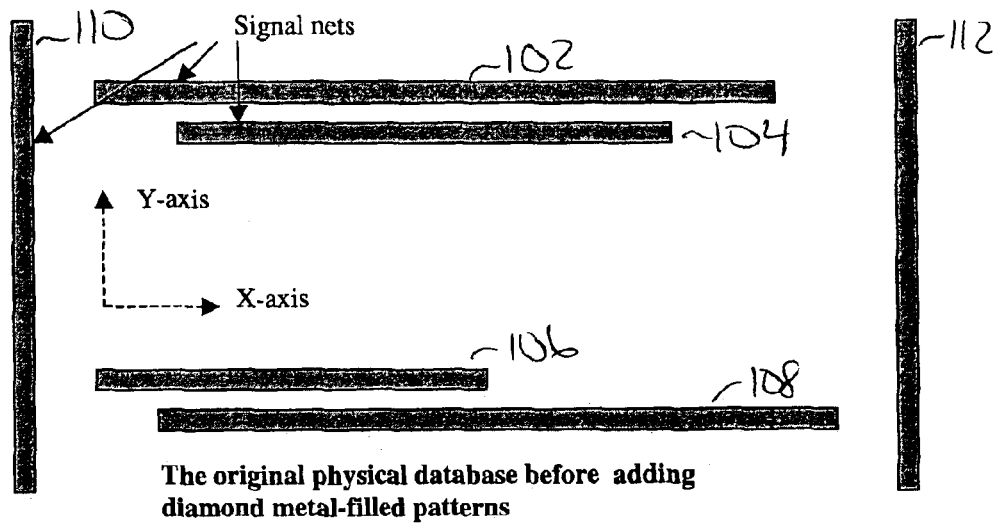
FIG. 1a depicts a top view of a portion of a semiconductor wafer having metal lines and interconnect lines in accordance with one embodiment of the invention.

FIG. 1a depicts a top view of a portion of a semiconductor wafer having metal lines 102, 104, 106, 108 and interconnect lines 110, 112 in accordance with one embodiment of the invention. The diamond metal-fill may be designed using a layout-parasitic extraction tool such as STAR_RCXT, available from SYNOPSYS Inc. located in Mountain View, Calif. Thus, the design tool may simulate the parasitic capacitance prior to adding the metal-fill, as well as after adding the metal-fill.

Figure 1B:
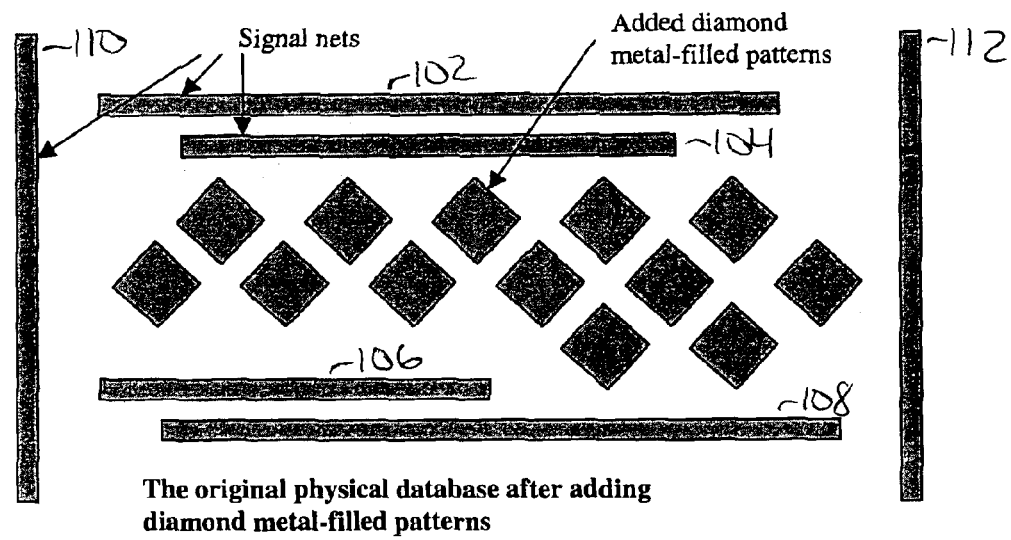
FIG. 1b depicts the top view of the portion of the semiconductor wafer of FIG. 1a in which diamond metal-fill is added in diamond patterns in accordance with various embodiments of the invention.

FIG. 1b depicts the top view of the portion of the semiconductor wafer of FIG. 1a in which diamond metal-fill is added in diamond patterns in accordance with various embodiments of the invention. As shown, a plurality of diamond shaped regions 114 are used to generate the metal-fill. In accordance with the embodiment illustrated, the diamond shaped metal-fill regions are placed at 45 degree angles with respect to the metal lines in accordance with Boston geometry. In other words, square shaped metal-fill regions are placed such that they are rotated 45 degrees with respect to the metal lines in either the y axis or the x axis. Moreover, each of the square shaped metal-fill regions is oriented in the same direction. In other words, the diamond shaped metal-fill regions are oriented perpendicular to the substrate, and in the same plane as one another.

The dimensions of the diamond shaped regions are such that they preferably form a 6-sided, 3-dimensional diamond shape. In other words, a 3-dimensional shape such as a square (or rectangular) block metal-fill region may be rotated 45 degrees to generate a diamond shaped block. In alternative embodiments, the diamond shaped region is a four-sided substantially planar surface, with four sides that are equivalent in length. The diamond-shaped patterned regions are preferably 3-dimensional.

Alternatively, a rectangular shaped 3-dimensional block or substantially planar patterned region may also be rotated 45 degrees with respect to the x-axis to generate an oblong diamond shaped region (not shown). In other words, the four lengths of the sides of the patterned region would include two opposing sides of a first length and two opposing sides of a second length different from the first length.

The buffer space between the diamonds, and between the diamonds and metal lines, is preferably approximately from 0.7 to 1.00 micro-meters. It is important to note that this spacing may be altered in order to increase or decrease the metal density.

In accordance with one embodiment, the metal-fill is grounded rather than floating. In other words, the diamond metal-fill regions are connected to the nearest ground connection. Alternatively, the diamond metal-fill regions may be left unconnected (i.e., floating). Grounded metal-fill is preferable, since capacitive coupling is minimized. In addition, metal-fill regions are at a known potential, and therefore layout-parasitic extraction tools can be used to re-verify and simulate a layout after the metal-fill has been placed.

Figure 2A:
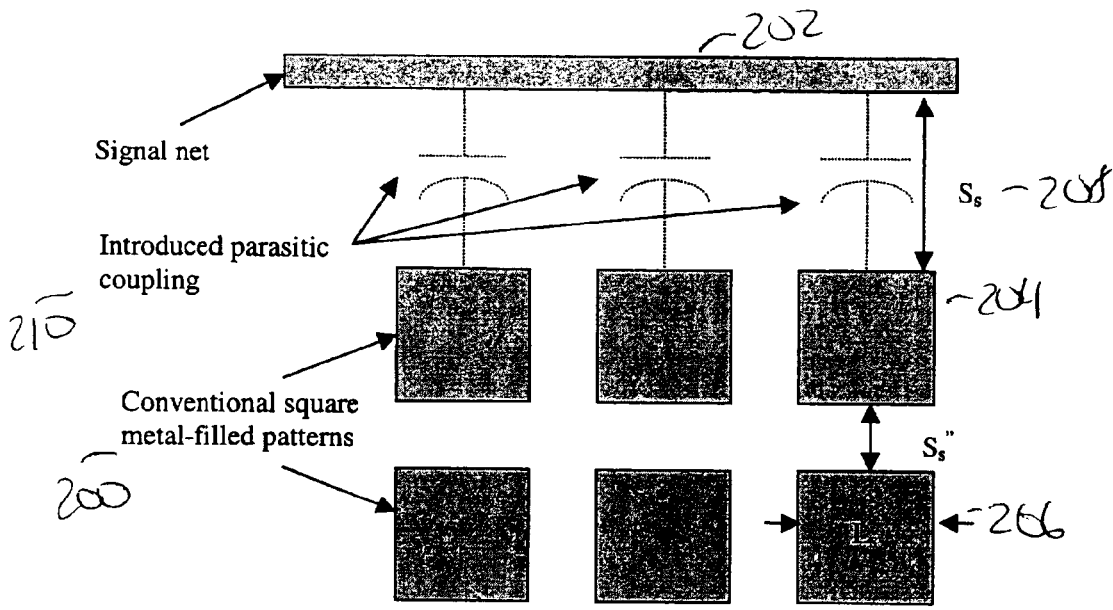
FIG. 2a depicts a top view of a portion of a semiconductor wafer in which a conventional square metal-fill pattern is added and associated parasitic coupling capacitance introduced by the square metal-fill.

FIG. 2a depicts a top view of a portion of a semiconductor wafer in which a conventional square metal-fill pattern is added and associated parasitic coupling capacitance introduced by the square metal-fill. In this example, the square shaped blocks are placed such that they are oriented parallel to the x and y axes in accordance with Manhattan geometry. As shown in FIG. 2a, conventional square shaped metal-filled patterns 200 are formed between two metal layers 202. The parasitic capacitance resulting from the conventional square metal-fill may be ascertained by computing capacitance associated with a single conventional square 204 having an associated coupling length L 206 and spacing S 208 between the square 204 and the metal layer 202 (i.e., signal net). Coupling length between a signal net (i.e. a metal line) and the square fill pattern may be defined as the distance measured from one of the edges (perpendicular with respect to its adjacent metal layer) to the other edge (perpendicular with respect to its adjacent metal layer) of a square fill pattern with equal-spacing between the metal layer and the square fill blocks. As shown, the coupling length L, of the conventional square metal-fill is the width of a square metal-fill block. The equation for computing the capacitance 210 resulting from the parasitic coupling between the metal layer 202 and the square metal-fill blocks 204 is as follows:

$$Cs_{total} = N*L_s*H*(E_{air}*E_{sio2}/S_s) \quad (1)$$

where $Cs_{total}$ denotes the total parasitic capacitance between the metal layer 202 and the conventional square metal fill blocks 204, N denotes the number of the square metal fill blocks adjacent to the metal layer, $L_s$ denotes the coupling length between the metal layer and one of the square metal fill blocks, H denotes the thickness of the square metal fill blocks in the z-axis, $E_{air}$ denotes the permitivity of free space, $E_{sio2}$ denotes the dielectric constant of $SiO_2$, and $S_s$ denotes the spacing between the metal layer and the square metal fill blocks.

As can be seen from Equation 1, the capacitance is proportional to the dielectric constant and inversely proportional to the separation distance S between two conductors. Thus, it would be desirable to increase the separation distance S.

Figure 2B:
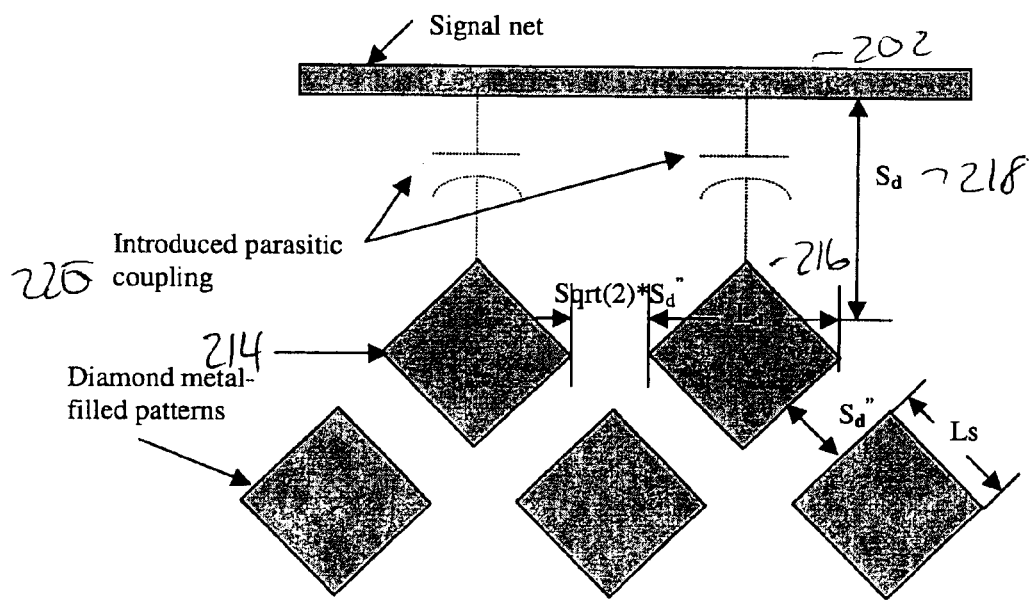
FIG. 2b depicts a top view of a portion of a semiconductor wafer in which a diamond metal-fill pattern is added and associated parasitic coupling capacitance introduced by the diamond metal-fill.

FIG. 2b depicts a top view of a portion of a semiconductor wafer in which a diamond metal-fill pattern is added and associated parasitic coupling capacitance introduced by the diamond metal-fill. In this example, the diamond shaped patterned regions are placed such that they are oriented 45 degrees with respect to the metal lines routing in either x-axis or y-axis directions. As shown in FIG. 2b, the diamond shaped metal-filled regions 212 are formed above at least one metal line. In other words, the diamond shaped metal-filled regions 212 may be formed at the same level as the metal layer (e.g., metal line) as well as above the metal line. In this example, the metal-filled regions are formed such that they lie between two metal layers 202. It is important to note that, as shown in FIGS. 2a and 2b, the same metal density can be achieved by using both the conventional square and the diamond metal-filled patterns.

The parasitic capacitance resulting from the diamond metal-fill may be ascertained by computing capacitance associated with a single diamond region 214 having an associated coupling length $L_d$ 216 and spacing $S_d$ 218 between the diamond 214 and the metal layer 202 (i.e., signal net). The equation for computing the capacitance 220 resulting from the parasitic coupling between the metal layer 202 and the diamond metal-fill regions 214 is as follows:

$$Cd_{total} = N*L_d*H*(E_{air}*E_{sio2}/S_d) \quad (2)$$

where $Cd_{total}$ denotes the total parasitic capacitance between the metal layer 202 and the diamond metal-fill blocks 214, N denotes the number of the diamond metal-fill blocks adjacent to the metal layer, $L_d$ denotes the coupling length between the metal layer and one of the diamond metal fill blocks, H denotes the thickness of the diamond metal fill blocks in the z-axis, $E_{air}$ denotes the permitivity of free space, $E_{sis2}$ denotes the dielectric constant of $SiO_2$, and $S_d$ denotes the spacing between the metal layer and the diamond metal-fill blocks.

As shown in FIG. 2b, the effective spacing between the metal layer 202 and the diamond metal-fill regions 214 is greater than that between the metal layer 202 and the square blocks of FIG. 2a. Specifically, the effective spacing $S_d$ shown in FIG. 2b may be calculated by the first-order approximation according to the following equation:

$$S_d = S_s + (L_s/2) \quad (3)$$

To demonstrate that the total parasitic coupling capacitance between a metal line and the diamond shaped metal-fill regions is less than that between a metal line and the conventional square metal-fill regions, a metal line with a length of $L_{metal}$ is assumed. In addition, to achieve the same density for both the diamond and the conventional metal-fill regions, $L_d = sqrt(2)*L_s$ and $S_s = S_d$ (see FIGS. 2a and 2b) should be required. In addition, the distance between one point of a diamond metal-fill region and a point of an adjacent diamond metal-fill region is preferably $Sqrt(2)*S_d$. Consequently, the comparison of the total parasitic coupling capacitance of a metal line interfacing between the diamond and the conventional square metal-fill patterns can be represented by the equations shown as follows:

$$Cd_{total} = N * L_d * (E_{air} * E_{sio}/S_d)$$

$$= N * [sqrt(2) * L_s] * (E_{air} * E_{sio}/S_d)$$

$$\{L_{metal}/[sqrt(2)*(L_s+S'')]\} * [sqrt(2)*L_s] * (E_{air}*E_{sio}/S_d)$$

$$= [L_{metal}*/(L_s+S'')] * L_s * \{E_0 * E_{sio}/[S_s+(L_s/2)]\}$$

$$> [L_{metal}*/(L_s+S'')] * L_5 * (E_0 * E_{sio}/S_s)$$

$$= N * L_s * (E_0 * E_{sio}/S_s)$$

$$= Cs_{total} \qquad (4)$$

Equation 4 mathematically demonstrates that the parasitic coupling capacitance introduced by the diamond metal-filled regions is less than that of the conventional square metal-filled regions.

The metal-fill regions are preferably designed using a pattern generation tool such as Hercules, available from SYNOPSYS Inc., located in Mountain View, Calif. The diamond shaped metal-filled regions can then be formed through conventional patterning techniques. Specifically, chip fabrication typically involves the basic operations of layering and patterning. Layering is an operation used to add thin layers of material (typically insulator, semi-conductor or conductor) to the surface of the semiconductor wafer. Layers are typically either grown (for example, thermal oxidation of silicon to grow a silicon dioxide dielectric layer) or deposited by a variety of techniques such as chemical vapor deposition (CVD) and physical vapor deposition (PVD), including evaporation and sputtering. Patterning, is an operation that is used to remove specific portions of the top layer or layers on the wafer surface. Patterning is usually accomplished through the use of photolithography (also known as photo-masking) to transfer the semiconductor design to the wafer surface. Patterning is often used to expose an area to be etched. The diamond shaped regions or blocks may be formed from any metal at various metal layers, including but not limited to, metal layer 1 or above.

FIG. 3 depicts a physical design database in which diamond metal-fill patterns are used in accordance with various embodiments of the invention. In this example, a physical design database 300 associated with a conventional circuit design tool such as Virtuoso from Cadence Design Systems, Inc. is illustrated. The database 300 represents the semiconductor wafer to which metal fill is to be added. Within the database 300, a metal interconnect line 302 is represented by a thin line. Various diamond metal-filled patterns may be generated within the physical design database 300 as shown at 304, enabling parasitic capacitance between the interconnect line 302 and the diamond metal-filled patterns 304 to be modeled. As shown, the pattern density across the chip may be varied. In this example, the pattern may be varied across the x-axis, where the x-axis is parallel to the integrated circuit substrate. Alternatively, the pattern may be varied across the y-axis.

Currently, for 0.13 micrometer, 90 nanometer, and below process technologies, the metal density of a chip fabricated on a silicon substrate must meet criteria specified by semiconductor foundries to ensure the silicon surface remains flat after the CMP process step has been completed. Those requirements are currently that for a ratio of total metal area of 40000 um$^2$ (e.g., the area of a 200 um by 200 um window), the metal density must be greater than 20 percent. In order to meet the above criteria, metal-fill patterns are added to the chip locations where the metal density is below 20 percent within the 200 um by 200 um window size. This may be accomplished by using a design tool such as that described above.

Once the diamond shaped metal-fill regions are formed above the metal layer, a dielectric is formed above the metal-fill. The dielectric layer is then planarized using CMP. In this manner, the present invention enables the silicon surface to remain substantially planar, thereby controlling intra-level dielectric thickness variation.

FIG. 4 depicts a three-dimensional view of a diamond metal-fill region with respect to the metal lines in accordance with various embodiments of the invention. As shown, diamond fill pattern is a 6-sided block and is shown with respect to metal layers 402 and 404. The diamond fill pattern is rotated 45 degrees with respect to the metal layers 402 and 404, as well as rotated 45 degrees with respect to the x and y axes. Thus, the diamond fill pattern lies parallel to the substrate. The height H of the diamond fill pattern lies along the Z-axis, perpendicular to the substrate. While the 6 sides of the diamond fill region may have the same length, it is possible to adjust the height H of the diamond fill region so that 2 of the 4 sides are equal in length, and the remaining 4 sides are equal in length.

The present invention enables metal-fill to be formed such that parasitic capacitance is reduced. This is accomplished through the formation of diamond shaped metal-fill regions across an integrated circuit. In this manner, advantages provided by conventional metal-fill techniques are preserved while reducing the parasitic capacitance introduced by the metal-fill.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. A method of forming metal-fill on an integrated circuit substrate, comprising:

forming a metal layer above the integrated circuit substrate;

patterning the metal layer such that a metal line is created;

forming a plurality of diamond-shaped metal regions at least one of above and adjacent to the metal line formed on the integrated circuit substrate such that the density of metal on the integrated circuit substrate is greater than a specified density, thereby ensuring that a surface of a dielectric formed above the metal line remains substantially planar after application of CMP to the dielectric layer, wherein each of the diamond-shaped metal regions is a 3-dimensional, 6-sided region oriented at a 45 degree angle, with respect to the metal line.

2. The method as recited in claim 1, wherein the specified density is 20 percent.

3. The method as recited in claim 1, wherein forming a plurality of diamond-shaped metal regions above the metal layer comprises:

forming a second metal layer above the metal layer; and patterning the second metal layer such that the plurality of diamond-shaped metal regions are formed.

4. The method as recited in claim 1, wherein each of the diamond-shaped metal regions is substantially planar.

5. The method as recited in claim 1, wherein each of the diamond shaped metal regions are oriented perpendicular to the substrate and in the same plane as one another.

6. The method as recited in claim 1, wherein each of the diamond-shaped metal regions is oriented parallel to the substrate.

7. The method as recited in claim 1, wherein each of the diamond-shaped metal regions is oriented in the same direction.

8. The method as recited in claim 1, wherein each of the diamond-shaped metal regions has six sides, each of the six sides having the same length.

9. The method as recited in claim 1, wherein each of the diamond-shaped metal regions has six sides, wherein four of the six sides have a first length, and two of the six sides have a second length.

10. The method as recited in claim 1, wherein at least a portion of the diamond-shaped metal regions are formed at the same level as the metal line.

11. The method as recited in claim 1, further comprising:

forming a dielectric layer above the diamond-shaped metal regions; and performing CMP on the dielectric layer such that the dielectric layer is substantially planar.

* * * * *